(12) United States Patent
Ren et al.

(10) Patent No.: US 12,061,849 B1
(45) Date of Patent: Aug. 13, 2024

(54) MODELING METHOD OF FLICKER NOISE OF SMALL-SIZED SEMICONDUCTOR DEVICE

(71) Applicant: Shanghai Jiao Tong University, Shanghai (CN)

(72) Inventors: Pengpeng Ren, Shanghai (CN); Zhigang Ji, Shanghai (CN)

(73) Assignee: SHANGHAI JIAO TONG UNIVERSITY, Shanghai (CN)

( * ) Notice: Subject to any disclaimer, the term of this patent is extended or adjusted under 35 U.S.C. 154(b) by 0 days.

(21) Appl. No.: 18/617,419

(22) Filed: Mar. 26, 2024

(30) Foreign Application Priority Data

May 26, 2023 (CN) .......................... 202310606229.9

(51) Int. Cl.
*G06F 30/20* (2020.01)
(52) U.S. Cl.
CPC .................................... *G06F 30/20* (2020.01)
(58) Field of Classification Search
None
See application file for complete search history.

(56) References Cited

U.S. PATENT DOCUMENTS

| | | | | |
|---|---|---|---|---|
| 6,850,441 B2 * | 2/2005 | Mokhlesi | ............ | G11C 11/5642 365/185.21 |
| 2013/0270610 A1 * | 10/2013 | Suess | ................ | H01L 27/14607 438/57 |
| 2020/0025619 A1 * | 1/2020 | Almasri | .................. | G01J 5/046 |

FOREIGN PATENT DOCUMENTS

| CN | 114510895 A | * | 5/2022 | |
|---|---|---|---|---|
| CN | 116610287 A | * | 8/2023 | |
| DE | 102012206089 A1 | * | 9/2013 | ....... H01L 27/14607 |
| JP | 2010267905 A | * | 11/2010 | |

* cited by examiner

Primary Examiner — Mohammed Alam
(74) Attorney, Agent, or Firm — NGUYEN TARBET IP LAW (57) ABSTRACT

A modeling method of flicker noise of small-sized semiconductor device is provided, which includes steps of measuring flicker noise of the small-sized semiconductor device under different gate voltages to obtain device noise data; separating noise obtained by testing under the different gate voltages in frequency domain, to obtain noise spectrums resulted from Random Telegraph Noise (RTN) defects and a noise spectrum resulted from mobility fluctuation; processing the noise spectrums resulted from the changes of the charged states of the RTN defects to obtain $S_{vg,I}$; processing the noise spectrum resulted from the mobility fluctuation to obtain $S_{id,II/III}$; and obtaining a total current noise intensity model, which is expressed as: $S_{id} = S_{id,I} + S_{id,II/III}$.

6 Claims, 5 Drawing Sheets

MODELING METHOD OF FLICKER NOISE OF SMALL-SIZED SEMICONDUCTOR DEVICE

CROSS-REFERENCE TO RELATED APPLICATION

This patent application claims the benefit and priority of Chinese Patent Application No. 202310606229.9 filed on May 26, 2023, the disclosure of which is incorporated by reference herein in its entirety as part of the present application.

TECHNICAL FIELD

The present disclosure relates to the field of semiconductor devices, in particular to a modeling method of flicker noise of a small-size semiconductor device.

BACKGROUND

As the size of integrated circuits shrinks, the impact of flicker noise (1/f noise) on analog circuits and mixed-signal circuits becomes significant, and the fluctuation of device noise further increases. How to model the flicker noise of advanced process devices and accurately describe its frequency, voltage dependence and fluctuation is a key problem to be solved urgently. At present, there are two traditional models to describe flicker noise, that is, a carrier number fluctuation model and a mobility fluctuation model.

The traditional carrier number fluctuation model holds that the source of flicker noise is the defects in the gate dielectric layer of the device. The defects capture and emit carriers randomly, leading to the fluctuation of device threshold voltage and drain-source current. Through the superposition of a large number of defects, the noise spectrum intensity is superimposed into the form of 1/f. The change of the defect state is described by elastic tunneling.

The mobility fluctuation model holds that the source of flicker noise is the scattering (lattice scattering, surface roughness scattering, impurity scattering, etc.) of carriers in the channel region, which is described by the empirical formula of a Hooge model. The noise intensity is reflected by the size of Hooge coefficient.

The existing Berkeley Short-channel IGFET Model (BSIM) is to describe the noise based on a traditional carrier number fluctuation theory. It is believed that the change of defect charge will not only affect the threshold voltage of a transistor, but also affect the mobility through mechanisms, such as Coulomb scattering. Three fitting parameters are used to describe the voltage dependence of noise intensity.

With the decrease of the size of the device, the number of effective defects in a dielectric layer decreases, and the 1/f form of flicker noise in a frequency domain cannot be explained by the superposition of a large number of defects, indicating that transistor noise is not completely resulted from defects. The voltage dependence of noise test results on advanced process devices is also inconsistent with the existing models, and presents great fluctuation. In order to correctly evaluate the influence of noise on circuit performance in circuit design, a new and accurate flicker noise model is needed.

SUMMARY

In view of the above defects of the conventional art, the technical problem to be solved by the present disclosure is that the flicker noise phenomenon of advanced process transistors becomes complicated. The present disclosure aims to establish a physics-based noise model to accurately describe the noise phenomenon and can be used for circuit simulation.

In order to achieve the above object, the present disclosure provides a modeling method of flicker noise of a small-sized semiconductor device, including steps of:

measuring flicker noise of the small-sized semiconductor device under different gate voltages to obtain device noise data;

separating noise obtained by testing under the different gate voltages in frequency domain, to obtain noise spectrums resulted from Random Telegraph Noise (RTN) defects and a noise spectrum resulted from mobility fluctuation;

processing the noise spectrums resulted from the changes of the charged states of the RTN defects to obtain $S_{vg,I}$;

processing the noise spectrum resulted from the mobility fluctuation to obtain $S_{id,II/III}$; and obtaining a total current noise intensity model, which is expressed as:

$$S_{id} = S_{id,I} + S_{id,II/III}$$

$$S_{id,I} = g_m^2 S_{vg,I}$$

where $g_m$ is transconductance of a transistor, $S_{vg,I}$ is equivalent voltage noise intensity from a dielectric region, and $S_{id,II/III}$ is current noise intensity of channel region and a source-drain region.

In an embodiment, in a process of measuring the flicker noise of the small-sized semiconductor device under the different gate voltages, a semiconductor parameter analyzer and a low-frequency noise tester are used to measure the small-sized semiconductor device.

In an embodiment, in a process of separating the noise obtained by testing under the different gate voltages in the frequency domain: a product of noise spectrum $S_{id}$ and frequency f is calculated, and the number of peaks in a product result is regarded as the number of RTN defects; and the noise spectrum $S_{id}$ is separated into the noise spectrum resulted from the mobility fluctuation and the noise spectrum resulted from change of charged state of each RTN defect, by fitting; wherein the noise spectrum resulted from the mobility fluctuation has a form of 1/f, and the noise spectrum resulted from change of the charged state of each RTN defect has a form of $A/1+(2\pi f\tau)^2$, where A is a fitted coefficient, and $\tau$ is an equivalent time constant.

In an embodiment, in a process of processing the noise spectrums resulted from the changes of the charged states of the RTN defects to obtain $S_{vg,I}$:

an energy level Et and a relaxation energy S of each RTN defect in a plurality of small-sized semiconductor devices are acquired to obtain distribution of the defect energy level Et and the relaxation energy S of each RTN defect;

according to the defect energy level Et and relaxation energy S of each RTN defect, defect capture time constant $\tau_c$ and defect emission time constant $\tau_e$ of a corresponding RTN defect are calculated by an nonradiative multi-phonon transition (NMP) model; a threshold voltage shift $\Delta V_{th}$ resulted from a single defect is obtained by charge sheet approximation: $\Delta V_{th} = mq/(WLC_{ox})$; and the sum of noise resulted from defects overall is the sum of noise of each RTN defect:

$$s_{vg,I} = \sum_{i=1}^{N} \frac{4(\Delta V_{th,i})^2}{(\tau_{c,i} + \tau_{e,i})[(1/\tau_{c,i} + 1/\tau_{e,i})^2 + (2\pi f)^2]}$$

where m is coefficient describing change of threshold voltage resulted from change of charge amount of each defect, q is unit charge, $WLC_{ox}$ is width, length and gate oxide capacitance of the transistor, N is the number of the RTN defects; $\tau_{c,i}$ and $\tau_{e,i}$ represent defect capture time constant and defect emission time constant of the i-th RTN defect, respectively.

In an embodiment, in a process of acquiring the energy level Et and the relaxation energy S of the small-sized semiconductor device: Et and S are calculated from an equivalent time constant $\tau$ and its change with the gate voltage according to an NMP model formula of defect time constant; where an expression of the defect time constant in form of the NMP model is:

$$\varepsilon_{12} = (S + E_{21})^2 / 4S$$

$$E_{21} = E_t + \varphi - E_v$$

$$\tau_c = \frac{1}{p\sigma v_{th}} \exp\left(\frac{\varepsilon_{12}}{kT}\right)$$

$$\tau_e = \tau_c \exp\left[-(E_f - (E_t + \varphi))/kT\right]$$

$$\frac{1}{\tau} = \frac{1}{\tau_c} + \frac{1}{\tau_e}$$

where $\varepsilon_{12}$ is barrier when the defect changes from state 1 to state 2, the state 1 indicates state of the defect detrapping carriers, and the state 2 indicates state of the defect trapping carriers; $E_{21}$ is energy level difference between the state 1 and the state 2, $E_t$ is the defect energy level, $\varphi$ is potential difference between defect position and channel due to applied voltage, $E_v$ is valence band energy level at the channel; p is hole concentration in the channel region, $\sigma$ is reaction cross section, $v_{th}$ is thermal movement rate of carrier, k is Boltzmann constant, T is thermodynamic temperature, $\tau_c$ is defect capture time constant, $\tau_e$ is defect emission time constant, and $E_f$ is Fermi energy level in the channel region.

In an embodiment, in a process of processing the noise spectrum resulted from the mobility fluctuation to obtain $S_{id,II/III}$, the noise spectrum resulted from the mobility fluctuation is separated into noise resulted from carrier scattering in the channel region and noise resulted from drain-source access resistance; wherein:

the noise resulted from carrier scattering in the channel region is described by a Hooge model, which is expressed as:

$$\frac{S_{id,II}}{I_D^2} = \frac{\alpha_H}{fN_C} = \frac{q\alpha_H \mu V_D}{fL^2 I_D}$$

where $I_D$ is drain-source current, $\alpha_H$ is Hooge coefficient, f is frequency, $N_C$ is the number of inversion carriers, $V_D$ is source-drain voltage, $\mu$ is mobility, and L is channel length;

an expression of the noise resulted from drain-source access resistance is $$\frac{S_{id,III}}{I_D^2} = \frac{K_r}{f}$$

where $K_r$ is resistance noise intensity coefficient; and using small signal analysis, an expression of total noise resulted from the mobility fluctuation when the transistor works in linear region is obtained as follows:

$$S_{id,II/III} = S_{id,II} \frac{(R_{tot} - R_{access})^2}{R_{tot}^2} + S_{id,III} \frac{R_{access}^2}{2R_{tot}^2}$$

$$R_{tot} = V_D / I_D$$

where $R_{tot}$ is resistance between source and drain of the transistor; $R_{access}$ is drain-source access resistance; change of test data $S_{id,II/III}$ obtained under different voltages is fit to obtain the Hooge coefficient $\alpha_H$ and the resistance noise intensity coefficient $K_r$; an average value and a distribution of the coefficients $\alpha_H$ and $K_r$ are obtained by statistical testing of a plurality of devices.

The present disclosure has the following beneficial effects.

1. The present disclosure solves the problem that the traditional noise model cannot describe the noise phenomenon of advanced process node devices, and the model established by the present disclosure can accurately describe frequency, voltage dependence and fluctuation of flicker noise of a small-sized device.

2. The test scheme, the separation method and the modeling method are universal and can be applied to different processes, and the model can be applied to circuit simulators.

3. The testing, data processing and modeling methods of the present disclosure are easy to be integrated in the tester, and have important guiding significance for the development of the tester program.

The concept, the specific structure and the technical effects of the present disclosure will be further explained with the accompanying drawings hereinafter, so as to fully understand the purpose, characteristics and effects of the present disclosure.

DETAILED DESCRIPTION OF THE EMBODIMENTS

The embodiments of the present disclosure are described through specific examples hereinafter. Those skilled in the art can easily understand other advantages and effects of the present disclosure from the contents disclosed in this specification. The present disclosure can also be implemented or applied by other different specific embodiments. Various details in this specification can be modified or changed based on different viewpoints and applications without departing from the spirit of the present disclosure. It should be noted that the following embodiments and features in the embodiments can be combined with each other without conflict.

It should be noted that the diagrams provided in the following examples only illustrate the basic idea of the present disclosure in a schematic manner, so that only the components related to the present disclosure are shown in the diagrams, rather than be drawn according to the number, shape and size of the components in actual implementation. In actual implementation, the type, number and proportion of each component can be changed at will, and the layout of the components may be more complicated.

Some exemplary embodiments of the present disclosure are described for illustrative purposes. It is to be understood that the present disclosure can be realized by other means not specifically shown in the drawings.

Figure 5:
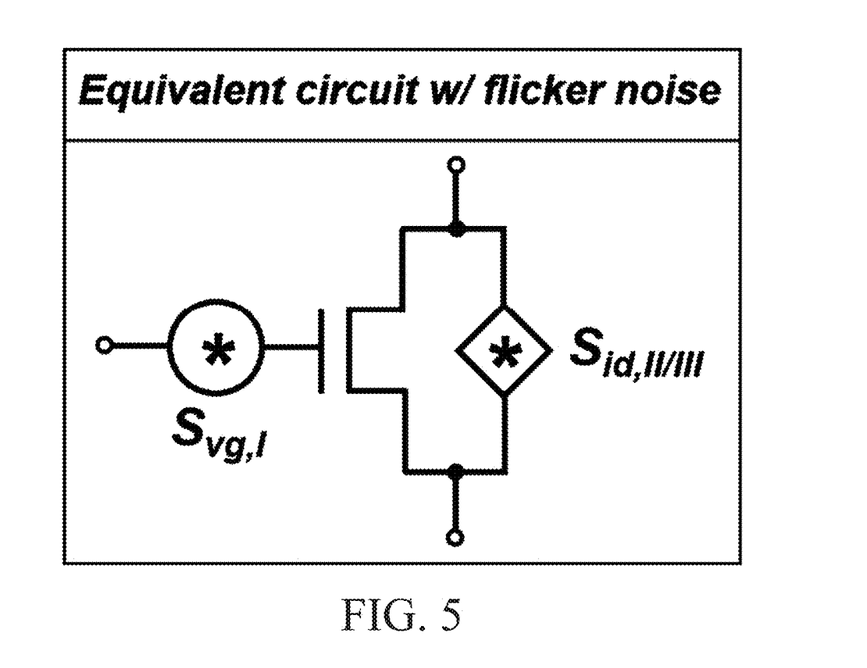
FIG. 5 is a schematic diagram of an equivalent circuit.
Figure 6:
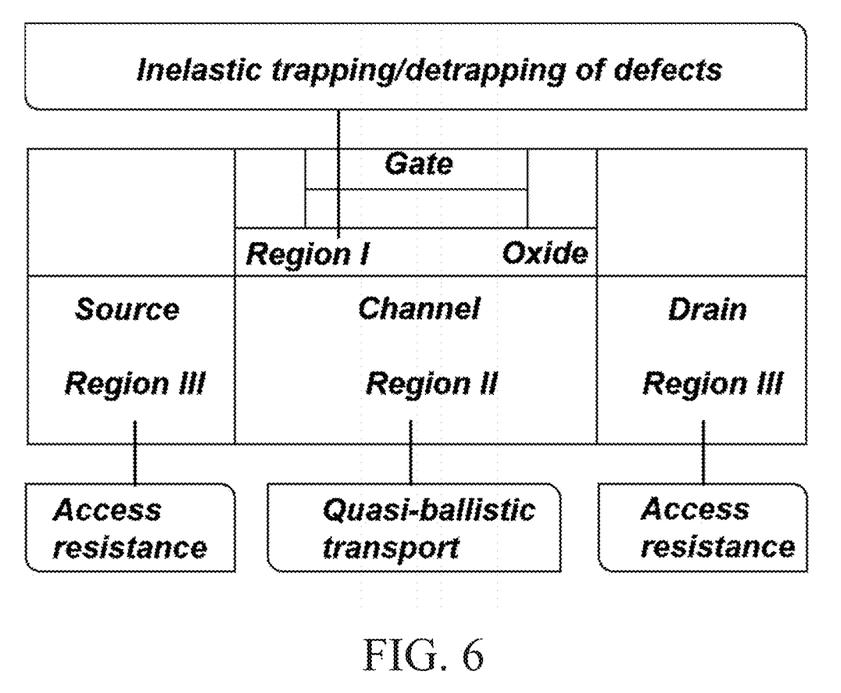
FIG. 6 is a schematic diagram of various regions of a device.

As shown in FIGS. 5 and 6, an embodiment of the present disclosure provides a modeling method of flicker noise of a small-sized semiconductor device, including steps (S1)-(S5).

Figure 1:
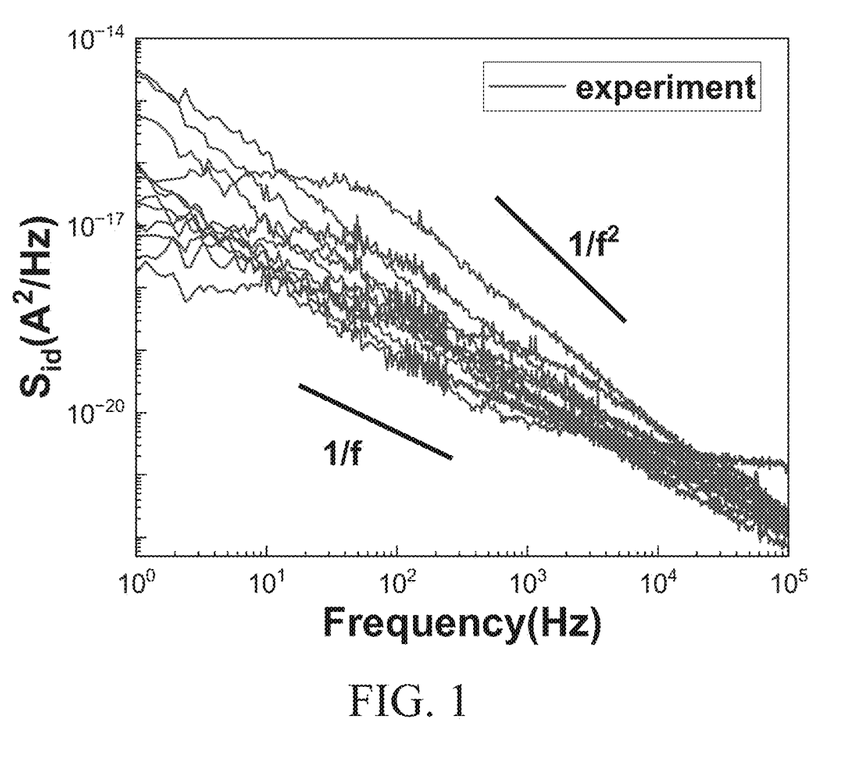
FIG. 1 is a schematic diagram showing test data for flicker noise.

In step (S1), flicker noise of the small-sized semiconductor device under different gate voltages is measured to obtain device noise data. In this step, a semiconductor parameter analyzer and a low-frequency noise tester are used to measure a small-sized semiconductor device, and the measurement results are shown in FIG. 1.

In step (S2), noise obtained by testing under the different gate voltages is separated in frequency domain, to obtain noise spectrums resulted from Random Telegraph Noise (RTN) defects and a noise spectrum resulted from mobility fluctuation.

In a process of separating the noise obtained by testing under the different gate voltages in the frequency domain, a product of noise spectrum $S_{id}$ measured in step S1 and frequency f is calculated, and the number of peaks in the product result is regarded as the number of RTN defects; and the noise spectrum $S_{id}$ is separated into the noise spectrum resulted from the mobility fluctuation and noise spectrum resulted from change of charged state of each RTN defect by fitting; where the noise spectrum resulted from the mobility fluctuation has a form of 1/f, and the noise spectrum resulted from change of the charged state of each RTN defect has a form of $$\frac{A}{1+(2\pi f\tau)^2}.$$

Figure 2A:
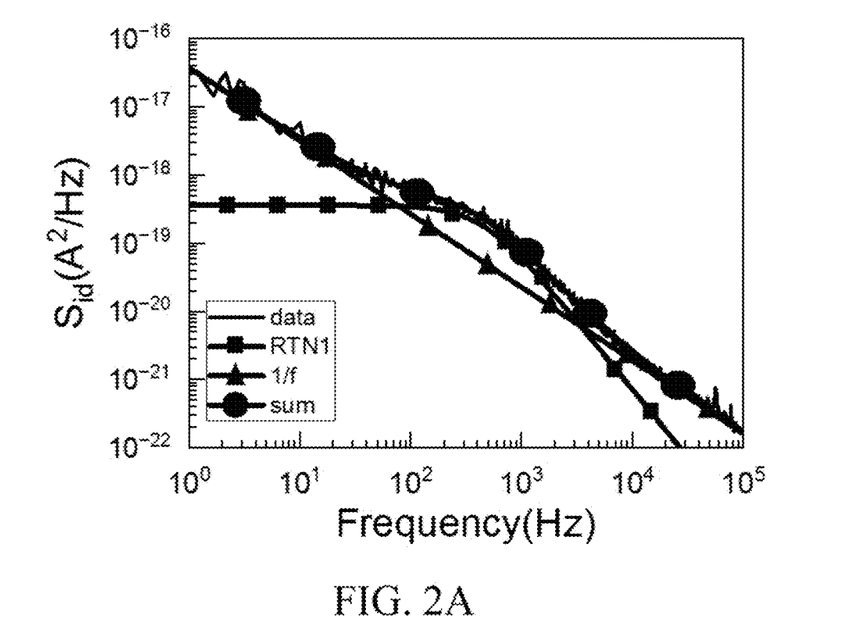
FIG. 2A is a schematic diagram of a separation method with one RTN defect.
Figure 2B:
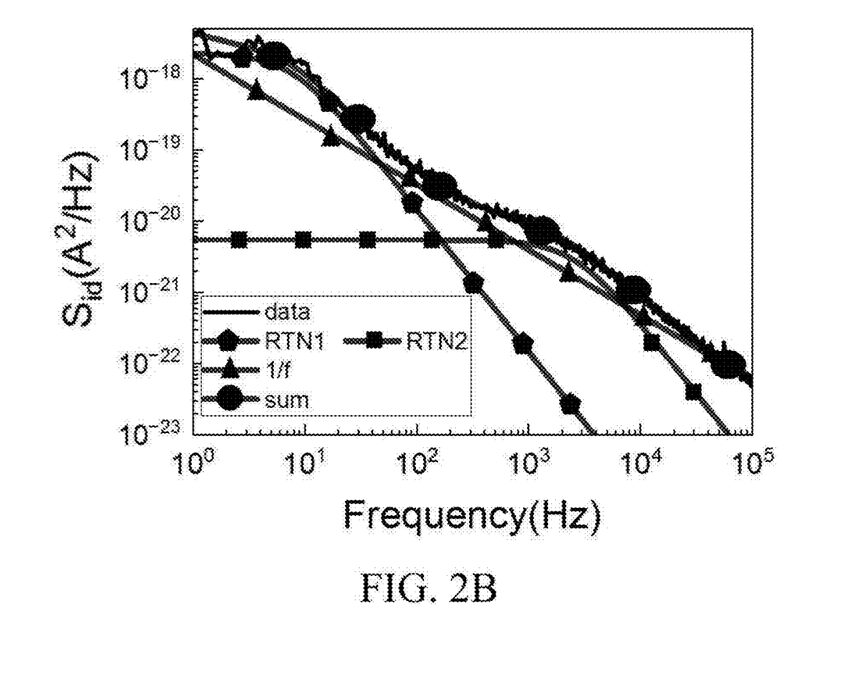
FIG. 2B is a schematic diagram of a separation method with two RTN defects.

As shown in FIG. 2A and FIG. 2B, they show the separation results with one RTN defect and two RTN defects respectively.

In step (S3), the noise spectrums resulted from the changes of the charged states of the RTN defects is processed to obtain $S_{vg,f}$.

Figure 3A:
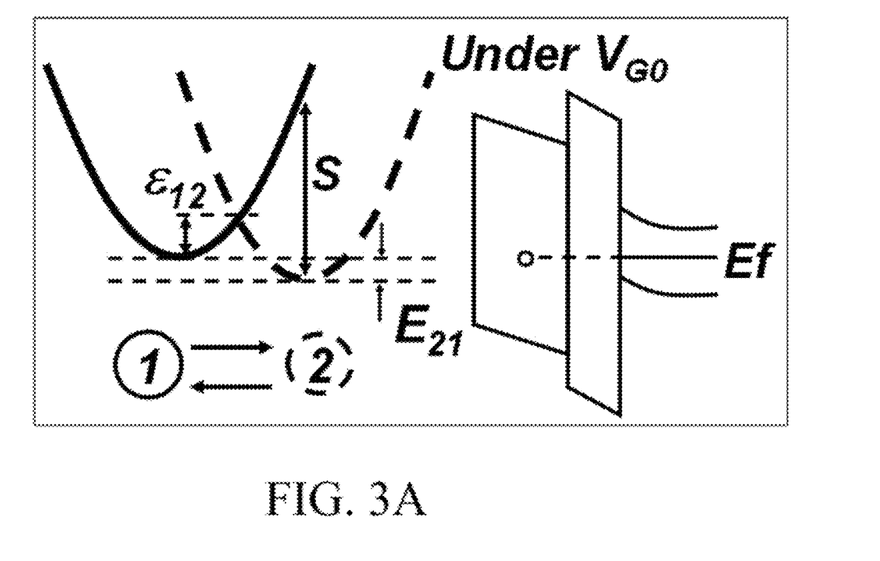
FIG. 3A is a schematic diagram of a part of a defect NMP model.
Figure 3B:
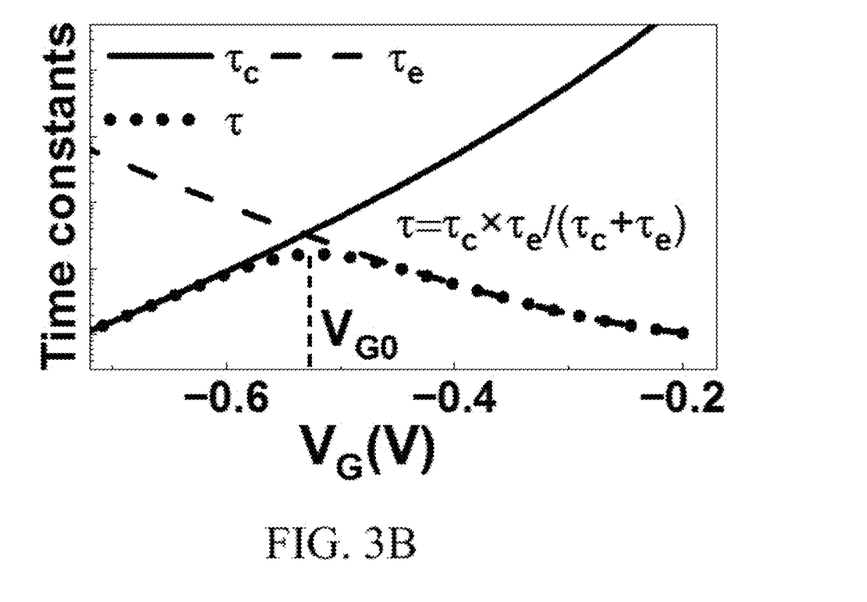
FIG. 3B is a schematic diagram of other part of a defect NMP model.

As shown in FIG. 3A and FIG. 3B, an energy level Et and a relaxation energy S of each RTN defect in a plurality of small-sized semiconductor devices are acquired, and distribution of the defect energy level Et and the relaxation energy S is obtained. In this process, Et and S are calculated from the equivalent time constant τ and its change with the gate voltage $V_G$ according to an NMP model formula (formulas 1 to 5) of defect time constant; where the expression of the defect time constant in form of the NMP model is:

$$\varepsilon_{12} = \frac{(S+E_{21})^2}{4S} \quad (1)$$

$$E_{21} = E_t + \varphi - E_v \quad (2)$$

$$\tau_c = \frac{1}{p\sigma v_{th}}\exp\left(\frac{\varepsilon_{12}}{kT}\right) \quad (3)$$

$$\tau_e = \tau_c\exp\left[-(E_f - (E_t + \varphi))/kT\right] \quad (4)$$

$$\frac{1}{\tau} = \frac{1}{\tau_c} + \frac{1}{\tau_e} \quad (5)$$

where $\varepsilon_{12}$ is barrier when the defect changes from state 1 to state 2, the state 1 indicates state of the defect detrapping carriers, and the state 2 indicates state of the defect trapping carriers. $E_{21}$ is energy level difference between the state 1 and the state 2, $E_t$ is defect energy level, φ is potential difference between defect position and channel due to the applied voltage, and $E_v$ is valence band energy level at the channel. p is hole concentration in channel region, σ is reaction cross section, $v_{th}$ is thermal movement rate of carrier, k is Boltzmann constant, T is thermodynamic temperature, $\tau_c$ is defect capture time constant, $\tau_e$ is defect emission time constant, and $E_f$ is Fermi energy level in the channel region.

In the process of solving the above model, the potential difference φ, the hole concentration p in the channel region and the Fermi energy level $E_f$ in the channel region can be obtained by the electrostatic model of the transistor. According to the above relationship, when the applied voltage results in $E_t+\varphi=E_f$, the equivalent time constant τ will reach the maximum. Therefore, based on the variation of the RTN defect time constant r with applied voltage obtained from experimental tests, the defect energy level $E_t$ can be obtained. On this basis, in the above expression, only the relaxation energy S is still unknown. The relaxation energy S can be calculated from the equivalent time constant τ inversely.

Defect capture time constant $\tau_c$ and defect emission time constant $\tau_e$ are calculated by an nonradiative multi-phonon (NMP) transition model according to the defect energy level Et and relaxation energy S; and a threshold voltage shift $\Delta V_{th}$ resulted from a single defect is obtained by charge sheet approximation:

$$\Delta V_{th}=mq/(WLC_{ox}) \quad (6)$$

The sum of noise resulted from the change of the charged states of RTN defects overall is the sum of noise of each RTN defect:

$$S_{vg,f} = \sum_{i=1}^{N} \frac{4(\Delta V_{th,i})^2}{(\tau_{c,i}+\tau_{e,i})\left[\left(1/\tau_{c,i}+1/\tau_{e,i}\right)^2+(2\pi f)^2\right]} \quad (7)$$

where m is coefficient describing change of threshold voltage resulted from change of charge amount of each defect, q is unit charge, $WLC_{ox}$ is width, length and gate oxide capacitance of a transistor (a small-sized semiconductor device), N is the number of defects; $\tau_{c,i}$ and $\tau_{e,i}$ represent the defect capture time constant and the defect emission time constant of the i-th RTN defect, respectively.

In step (S4), the noise spectrum resulted from the mobility fluctuation is processed to obtain $S_{id,II/III}$.

Figure 4:
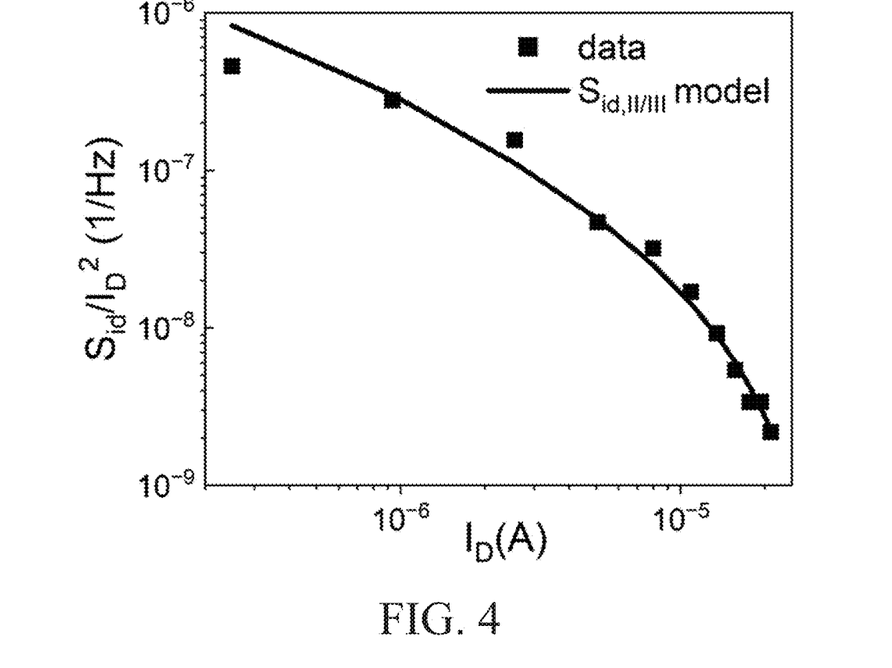
FIG. 4 is a schematic diagram of a mobility fluctuation noise model.

In this process, the noise spectrum resulted from the mobility fluctuation is separated into noise resulted from carrier scattering in the channel region and noise resulted from drain-source access resistance; wherein:

the noise resulted from carrier scattering in the channel region is described by a Hooge model, in which the expression is:

$$\frac{S_{id,II}}{I_D^2} = \frac{\alpha_H}{fN_C} = \frac{q\alpha_H \mu V_D}{fL^2 I_D} \quad (8)$$

where $I_D$ is drain-source current, $\alpha_H$ is Hooge coefficient, f is the frequency, $N_C$ is the number of inversion carriers, $V_D$ is source-drain voltage, μ is mobility, and L is channel length;

the expression of the noise resulted from drain-source access resistance is $$\frac{S_{id,III}}{I_D^2} = \frac{K_r}{f} \quad (9)$$

where $K_r$ is resistance noise intensity coefficient; and using small signal analysis, the expression of the total noise resulted from the mobility fluctuation when the transistor works in linear region is obtained as follows:

$$S_{id,II/III} = S_{id,II} \frac{(R_{tot} - R_{access})^2}{R_{tot}^2} + S_{id,III} \frac{R_{access}^2}{2R_{tot}^2} \quad (10)$$

$$R_{tot} = V_D/I_D \quad (11)$$

where $R_{tot}$ is resistance between the source and the drain of the transistor (voltage $V_D$ between the source and the drain divided by current $I_D$ between the source and the drain); $R_{access}$ is drain-source access resistance. As shown in FIG. 4, the change of the test data $S_{id,II/III}$ obtained under different voltages is fit to obtain the Hooge coefficient $\alpha_H$ and the resistance noise intensity coefficient $K_r$; the average value and the distribution of the coefficients $\alpha_H$ and $K_r$ are obtained by statistical testing of a plurality of devices.

In step (S5), a total current noise intensity model is obtained, in which the expression is:

$$S_{id} = S_{id,I} + S_{id,II/III} \quad (12)$$

$$S_{id,I} = g_m^2 S_{vg,I} \quad (13)$$

where $g_m$ is transconductance of a transistor, $S_{vg,I}$ is equivalent voltage noise intensity from a dielectric region, and $S_{id,II/III}$ is current noise intensity of channel region and a source-drain region. FIG. 5 is a schematic diagram of the model.

The scheme of this embodiment has the following advantages.

1. The present disclosure solves the problem that the traditional noise model cannot describe the noise phenomenon of advanced process node devices, and the model established by the present disclosure can accurately describe frequency and voltage dependences of flicker noise of a small-sized device.

2. The test scheme, the separation method and the modeling method are universal and can be applied to different processes, and the model can be applied to circuit simulators.

3. The testing, data processing and modeling methods of the present disclosure are easy to be integrated in the tester, and have important guiding significance for the development of the tester program.

The above-mentioned embodiments only illustrate the principle and the effect of the present disclosure, and are not used to limit the present disclosure. Those skilled in the art can modify or change the above embodiments without violating the spirit and scope of the present disclosure. Therefore, all equivalent modifications or changes made by those having ordinary knowledge in the technical field without departing from the spirit and technical ideas disclosed in the present disclosure should still be covered by the claims of the present disclosure.

What is claimed is:

1. A modeling method of flicker noise of a small-sized semiconductor device, comprising steps of:

measuring flicker noise of the small-sized semiconductor device under different gate voltages to obtain device noise data;

separating noise obtained by testing under the different gate voltages in frequency domain, to obtain noise spectrums resulted from Random Telegraph Noise (RTN) defects and a noise spectrum resulted from mobility fluctuation;

processing the noise spectrums resulted from the changes of the charged states of the RTN defects to obtain $S_{vg,I}$;

processing the noise spectrum resulted from the mobility fluctuation to obtain $S_{id,II/III}$; and obtaining a total current noise intensity model, which is expressed as:

$S_{id} = S_{id,I} + S_{id,II/III}$ $S_{id,I} = g_m^2 S_{vg,I}$ wherein $g_m$ is transconductance of a transistor, $S_{vg,I}$ is equivalent voltage noise intensity from a dielectric region, and $S_{id,II/III}$ is current noise intensity of a channel region and a source-drain region.

2. The modeling method of flicker noise of the small-sized semiconductor device according to claim 1, wherein in a process of measuring the flicker noise of the small-sized semiconductor device under the different gate voltages, a semiconductor parameter analyzer and a low-frequency noise tester are used to measure the small-sized semiconductor device.

3. The modeling method of flicker noise of the small-sized semiconductor device according to claim 1, wherein in a process of separating the noise obtained by testing under the different gate voltages in the frequency domain:

a product of noise spectrum $S_{id}$ and frequency f is calculated, and a number of peaks in a product result is regarded as a number of RTN defects; and the noise spectrum $S_{id}$ is separated into the noise spectrum resulted from the mobility fluctuation and the noise spectrum resulted from change of charged state of each RTN defect, by fitting; wherein the noise spectrum resulted from the mobility fluctuation has a form of 1/f, and the noise spectrum resulted from change of the charged state of each RTN defect has a form of $$\frac{A}{1+(2\pi f\tau)^2},$$

wherein A is a fitted coefficient, and $\tau$ is an equivalent time constant.

4. The modeling method of flicker noise of the small-sized semiconductor device according to claim 1, wherein in a process of processing the noise spectrums resulted from the changes of the charged states of the RTN defects to obtain $S_{vg,I}$:

an energy level Et and a relaxation energy S of each RTN defect in a plurality of small-sized semiconductor devices are acquired to obtain distribution of the defect energy level Et and the relaxation energy S of each RTN defect;

according to the defect energy level Et and relaxation energy S of each RTN defect, a defect capture time constant $\tau_c$ and a defect emission time constant $\tau_e$ of a corresponding RTN defect are calculated by an nonradiative multi-phonon transition (NMP) model;

a threshold voltage shift $\Delta V_{th}$ resulted from a single defect is obtained by charge sheet approximation:

$$\Delta V_{th} = mq/(\text{WLC}_{ox}); \text{ and}$$

a sum of noise resulted from defects overall is a sum of noise of each RTN defect:

$$S_{vg,I} = \sum_{i=1}^{N} \frac{4(\Delta V_{th,i})^2}{(\tau_{c,i}+\tau_{e,i})\left[\left(1/\tau_{c,i}+1/\tau_{e,i}\right)^2+(2\pi f)^2\right]}$$

wherein m is a coefficient describing change of threshold voltage resulted from change of charge amount of each defect, q is a size of unit charge, $\text{WLC}_{ox}$ is a width, a length and a gate oxide capacitance of the transistor, N is a number of the RTN defects; $\tau_{c,i}$ and $\tau_{e,i}$ represent a defect capture time constant and a defect emission time constant of an i-th RTN defect, respectively.

5. The modeling method of flicker noise of the small-sized semiconductor device according to claim 4, wherein in a process of acquiring the energy level Et and the relaxation energy S of the small-sized semiconductor device:

Et and S are calculated from an equivalent time constant $\tau$ and its change with the gate voltage according to an NMP model formula of a defect time constant; wherein an expression of the defect time constant in form of the NMP model is:

$$\varepsilon_{12} = (S+E_{21})^2/4S$$

$$E_{21} = E_t + \varphi - E_v$$

$$\tau_c = \frac{1}{p\sigma v_{th}}\exp\left(\frac{\varepsilon_{12}}{kT}\right)$$

$$\tau_e = \tau_c \exp\left[-(E_f - (E_t+\varphi))/kT\right]$$

$$\frac{1}{\tau} = \frac{1}{\tau_c} + \frac{1}{\tau_e}$$

wherein $\varepsilon_{12}$ is a barrier when the defect changes from state 1 to state 2, the state 1 indicates a state of the defect detrapping carriers, and the state 2 indicates a state of the defect trapping carriers; $E_{21}$ is an energy level difference between the state 1 and the state 2, $E_t$ is the defect energy level, $\varphi$ is a potential difference between a defect position and a channel due to applied voltage, $E_v$ is a valence band energy level at the channel; p is a hole concentration in the channel region, $\sigma$ is a reaction cross section, $v_{th}$ is a thermal movement rate of a carrier, k is a Boltzmann constant, T is a thermodynamic temperature, $\tau_c$ is a defect capture time constant, $\tau_e$ is a defect emission time constant, and $E_f$ is an Fermi energy level in the channel region.

6. The modeling method of flicker noise of the small-sized semiconductor device according to claim 1, wherein in a process of processing the noise spectrum resulted from the mobility fluctuation to obtain $S_{id,II/III}$:

the noise spectrum resulted from the mobility fluctuation is separated into noise resulted from carrier scattering in the channel region and noise resulted from drain-source access resistance; wherein:

the noise resulted from carrier scattering in the channel region is described by a Hooge model, which is expressed as:

$$\frac{S_{id,II}}{I_D^2} = \frac{\alpha_H}{fN_C} = \frac{q\alpha_H \mu V_D}{fL^2 I_D}$$

wherein $I_D$ is drain-source current, $\alpha_H$ is a Hooge coefficient, f is frequency, $N_C$ is a number of inversion carriers, $V_D$ is source-drain voltage, $\mu$ is mobility, and L is a channel length;

an expression of the noise resulted from drain-source access resistance is $$\frac{S_{id,III}}{I_D^2} = \frac{K_r}{f}$$

wherein $K_r$ is a resistance noise intensity coefficient; and using small signal analysis, an expression of total noise resulted from the mobility fluctuation when the transistor works in linear region is obtained as follows:

$$S_{id,II/III} = S_{id,II}\frac{(R_{tot}-R_{access})^2}{R_{tot}^2} + S_{id,III}\frac{R_{access}^2}{2R_{tot}^2}$$

$$R_{tot} = V_D/I_D$$

wherein $R_{tot}$ is a resistance between a source and a drain of the transistor; $R_{access}$ is drain-source access resistance; change of test data $S_{id,II/III}$ obtained under different voltages is fit to obtain the Hooge coefficient $\alpha_H$ and the resistance noise intensity coefficient $K_r$; an average value and a distribution of the coefficients $\alpha_H$ and $K_r$ are obtained by statistical testing of a plurality of devices.

* * * * *